(12) United States Patent
Suzuki et al.

(10) Patent No.: US 7,215,262 B2
(45) Date of Patent: May 8, 2007

(54) DIGITAL SIGNAL PROCESSING APPARATUS AND DIGITAL SIGNAL PROCESSING METHOD

(75) Inventors: Nobukazu Suzuki, Kanagawa (JP); Gen Ichimura, Tokyo (JP); Masayoshi Noguchi, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/219,757

(22) Filed: Sep. 7, 2005

(65) Prior Publication Data
US 2006/0071833 A1    Apr. 6, 2006

(30) Foreign Application Priority Data
Sep. 16, 2004  (JP)  ............................. 2004-270261

(51) Int. Cl.
*H03M 3/02* (2006.01)
*G06F 17/00* (2006.01)
(52) U.S. Cl. ...................... 341/76; 341/143; 700/94; 381/104
(58) Field of Classification Search .................. 341/76, 341/77, 143
See application file for complete search history.

(56) References Cited
U.S. PATENT DOCUMENTS
6,078,621 A * 6/2000 Eastty et al. ................. 341/143
6,144,328 A * 11/2000 Eastty et al. ................. 341/143

* cited by examiner

*Primary Examiner*—Howard L. Williams
(74) *Attorney, Agent, or Firm*—Oblon, Spivak, McClelland, Maier & Neustadt, P.C.

(57) ABSTRACT

The present invention provides a digital signal processing apparatus which can perform batch processing of mixing and gain controlling, etc., one time while the frequency characteristics of different filters are being mixed to a plurality of input signals in case of the re-quantization only once. The present invention provides a digital signal processing apparatus for outputting a 1-bit digital signal by performing a delta sigma modulation process on a plurality of input signals, which includes a plurality of integrating unit, a plurality of feedforward arithmetic units that supply an arithmetic result calculated based on an independent feedforward coefficient to each input signal, to each of the plurality of the integrating units, a quantizing unit that quantizes the integrated output outputted from one of the plurality of the integrating unit, a plurality of feedback arithmetic units that supply an arithmetic result obtained by calculating quantized data outputted from the quantizing unit based on the independent feedback coefficient, to each of the plurality of the integrating units, and a mixing unit that mixes the output of the integrating unit of the front stage, the output of the feedforward arithmetic unit and the output of the feedback arithmetic unit and supplies the mixed result to the integrating unit of the rear stage.

9 Claims, 13 Drawing Sheets

DIGITAL SIGNAL PROCESSING APPARATUS AND DIGITAL SIGNAL PROCESSING METHOD

CROSS REFERENCES TO RELATED APPLICATIONS

The present invention contains subject matter related to Japanese Patent Application JP 2004-270261 filed in the Japanese Patent Office on Sep. 16, 2004, the entire contents of which being incorporated herein by reference.

BACKGROUND OF THE INVENTION

1. Field of the Invention

This invention relates to a digital signal processing apparatus and a digital signal processing method, and more particularly, to a digital signal processing apparatus and a digital signal processing method which inputs a delta sigma ($\Delta\Sigma$) modulated digital audio signal.

2. Description of the Related Art

A $\Delta\Sigma$ modulated high speed 1-bit audio signal has a form having a very high sampling frequency and a short data word length (for example, a sampling frequency is 64 times as large as 44.1 kHz and a data word length is 1 bit) as compared with the format (for example, a sampling frequency is 44.1 kHz, and a data word length is 16 bits) of the data used for a conventional digital audio, and has a feature of wide transmission frequency band. Moreover, in the audio band of a low frequency as compared with an over sampling frequency of 64 times of the 1-bit signal by the $\Delta\Sigma$ modulation, a high dynamic range can be ensured. This feature can be applied to a recorder of high tone quality or a data transmission.

A $\Delta\Sigma$ modulation circuit itself is not particularly new technology, but since a circuit configuration is suitable for integrated circuiting and the accuracy of an AD conversion can be relatively simply obtained, this is a circuit frequently used heretofore for the interior or the like of an AD converter. Furthermore, the $\Delta\Sigma$ modulated signal can be returned to an analog audio signal by passing the signal through a simple analog pass filter.

Incidentally, in order to realize the reproduction suitable for various audition environment or audition equipment and materials when the multichannel of a super audio CD is reproduced, a digital signal processing (Digital Signal Processor: DSP) or a digital surround processing (Digital Surround Processor: DSP) becomes indispensable. For example, in the combination of a small size speaker and a subwoofer which cannot achieve a low frequency tone quality, a signal from which low frequency components are removed, is outputted to the small size speaker, and only the low frequency components are outputted by mixing the respective channels to the subwoofer. Therefore, a signal process using a filter, a mixer, etc., is required.

Heretofore, in order to subject the 1-bit audio signal obtained by, for example, the $\Delta\Sigma$ modulation to a digital signal processing (DSP), as it is, the DSP processing is performed for each function. Accordingly, a re-quantization noise is generated each time, and its tone quality is deteriorated.

Furthermore, in a digital signal processor 120 shown in FIG. 1A, in the case where an input signal $X_1$ of 1-bit audio signal obtained by the $\Delta\Sigma$ modulation, and an input signal $X_0$ of the 1-bit audio signal which the low frequency components have passed through an LPF 121 are mixed by a mixer 122, a time delay to the input signal $X_0$ by the passage through the LPF 121.

It is needless to say that the low frequency components taken out by the LPF 121 are re-quantized by a quintic re-$\Delta\Sigma$ modulator 124 of the structure shown, for example, in FIG. 2. Also, the audio signal mixed by the mixer 122 is re-quantized by a tertiary re-$\Delta\Sigma$ modulator 125 shown in FIG. 2. Furthermore, the output after a gain is controlled for attenuation processing by an attenuator 126 after the mixing, is also re-quantized by the tertiary re-$\Delta\Sigma$ modulator 125 shown in FIG. 2.

Therefore, when the quantized noise level of FIG. 1B is observed, a re-quantization noise by the re-$\Delta\Sigma$ modulation at a filtering time by the LPF 121, a re-quantization noise by the re-$\Delta\Sigma$ modulation at a mixing time by the mixer 122, and a re-quantization noise by the re-$\Delta\Sigma$ modulation at a gain controlling time by the attenuator 123 are applied to the original quantization noise level which the input signal $X_1$ and the input signal $X_0$ have, and the re-quantization noise is increased.

Furthermore, in a digital signal processor 130 shown in FIG. 3A, even when the input signal $X_1$ which high frequency components have passed through an HPF 132 and the input signal $X_0$ which low frequency components have passed through an LPF 131 are mixed by a mixer 133, the high frequency components taken out by the HPF 132 are re-quantized by the re-$\Delta\Sigma$ modulator shown in FIG. 2. The low frequency components taken out by the LPF 131 are also re-quantized by the re-$\Delta\Sigma$ modulator shown in FIG. 2. Moreover, the audio signal mixed by the mixer 133 is also re-quantized by the re-$\Delta\Sigma$ modulator. The output after the gain is controlled for attenuation processing by an attenuator 134 after the mixing is re-quantized by the re-$\Delta\Sigma$ modulator.

Therefore, when the quantization noise level of FIG. 3A is observed, a re-quantization noise by the re-$\Delta\Sigma$ modulation at the filtering time by the LPF 131 and the HPF 132, a re-quantization noise by the re-$\Delta\Sigma$ modulation at the mixing time by the mixer 133, and a re-quantization noise by the re-$\Delta\Sigma$ modulation at a gain controlling time by the attenuator 134 are applied to the original quantization noise level which the input signal $X_1$ and the input signal $X_0$ have, and the quantization noise is increased.

To solve this problem, for example, it is most ideal to perform all the processes to be performed as DSP processing in case of the re-quantization only once by one delta sigma modulator. A method of regulating and mixing the gains by the one delta sigma modulation was very easy. The following Non-patent Documents 1 and 2 each describes a 1-bit digital filter.

Non-patent document 1: Casey, N. M. and Angus, J. A. S., "One Bit Digital Processing of Audio Signals," Proc. Audio Eng. Soc., 95th AES Convention 1993, New York.

Non-patent document 2: Casey, N. M., "One Bit Digital Processing of Audio Signals," MSc Thesis, Department of Electronics, University of York, October 1933.

SUMMARY OF THE INVENTION

When the frequency characteristics of filters are different and mixed to a plurality of inputs, it is not easy to mix the different inputs of the frequency characteristics, and to control the gain, and it has not been concretely clarified.

It is therefore desirable to provide a digital signal processing apparatus and a digital signal processing method which can perform batch processing of mixing and gain controlling, etc., one time while the frequency characteristics of different filters are being mixed to a plurality of input signals in case of the re-quantization only once based on a 1-bit digital filter described in the Non-patent Documents 1 and 2.

According to the present invention, there is provided a digital signal processing apparatus for outputting a 1-bit digital signal by performing a delta sigma modulation process on a plurality of input signals, including: a plurality of integrating means; a plurality of feedforward calculation means for supplying an arithmetic result calculated based on an independent feedforward coefficient to each input signal, to each of the plurality of the integrating means; a quantization means for quantizing integrated output outputted from one of the plurality of the integrating means; a plurality of feedback arithmetic means for supplying, to each of the plurality of integrating means, a result obtained by calculating quantized data outputted from the quantization means based on an independent feedback coefficient; and a mixing means for mixing the output of the integrating means of the front stage and the output of the feedforward arithmetic means, and the output of the feedback arithmetic means and supplying the mixed result to the integrating means of the rear stage.

According to the present invention, there is provided a digital signal processing apparatus for outputting a 1-bit digital signal by performing a delta sigma modulation process on a plurality of the input signals, executing at least a filter function which causes the plurality of input signals to have different frequency characteristics, and a mixing function which mixes the plurality of signals each having a different frequency characteristic due to the at least one filter function, by a delta sigma modulator including: an integrating means having a plurality of integrators; a quantization means for subjecting an integrated output from the integrating means to quantization processing; a plurality of feedforward arithmetic means for performing arithmetic processing on the plurality of input signals by using feedforward coefficients of a plurality of systems corresponding to the plurality of signals and supplying an arithmetic result to the integrating means; and a plurality of feedback arithmetic means for performing arithmetic processing on the quantized output from the quantization means using feedback coefficients to feed back an arithmetic result to the integrating means, by using the approximately obtained feedforward coefficients of the plurality of systems and feedback coefficients.

The delta sigma modulator includes a sigma section corresponding to the number of the plurality of input signals, and one delta section. The delta sigma modulator further performs a gain control function of controlling the gain. Furthermore, the approximately obtained feedforward coefficients of the plurality of systems and feedback coefficients are written in a storage means, and the value is loaded to the coefficient of the delta sigma modulator by a control signal or the like.

According to the present invention, there is provided a digital signal processing method for outputting a 1-bit digital signal by performing a delta sigma modulating process on a plurality of the input signals, executing at least a filter function which causes the plurality of input signals to have different frequency characteristics, and a mixing function which mixes the plurality of signals each having a different frequency characteristic due to the at least one filter function, by the steps including: an integrating step of performing integrating processing on the input signals using a plurality of integrators; a quantization step of subjecting an integrated output from the integrating step to quantization processing; a plurality of feedforward arithmetic steps of supplying, to the integrating step, by performing arithmetic processing on the plurality of input signals by using feedforward coefficients of a plurality of systems corresponding to the plurality of signals; and a plurality of feedback arithmetic step of performing arithemtic processing on the quantized output from the quantization step, using feedback coefficients to feed back an arithmetic result to the integrating step, by using the approximately obtained feedforward coefficients of the plurality of systems and feedback coefficients.

Therefore, the digital signal processing method includes: a first transfer function calculating step of calculating the transfer function of at least one filter function which causes the plurality of input signals to have different frequency characteristics; a second transfer function calculating step of calculating the transfer function of a tertiary noise shaper; a first approximate coefficient calculating step of calculating an approximate coefficient corresponding to the feedforward coefficient by a sigma step corresponding to the number of the plurality of the input signals; a second approximate coefficient calculating step of calculating the approximate coefficient corresponding to the feedback coefficient by one delta step; a feedforward coefficient calculating step of calculating the feedforward coefficient from the first approximate coefficient calculated by the first approximate coefficient calculating step; and a feedback coefficient calculating step of calculating the feedback coefficient from the second approximate coefficient calculated by the second approximate coefficient calculating step. The digital signal processing method further performs a gain control function of controlling the gain.

According to the present invention, when the DSP processing, such as a filtering process, a mixing process, an attenuating process, etc., is performed while maintaining one bit, batch processing is performed. Since only one time quantization noise is generated, an S/N ratio can be sufficiently highly held as compared with prior art, and higher tone equality can be ensured.

Furthermore, in a conventional structural example, when the low frequency component of the one input signal and the other input signal are mixed, the one input signal is passed through a re-delta sigma modulator, and thereby generating a delay and mixing with the delay. However, the present invention has an effect of mixing without delay since the re-delta sigma is performed one time.

DETAILED DESCRIPTION OF THE PREFERRED EMBODIMENTS

The best mode of carrying out the present invention will be described. This first embodiment is a digital signal processing apparatus including a re-ΔΣ modulator for incorporating different frequency characteristics in a plurality of, for example, two input signals $X_0$ and $X_1$ obtained by a delta sigma (ΔΣ) modulation to mix them, further controlling the gains simultaneously, and performing the re-ΔΣ modulation process.

Figures 1A, 1B:
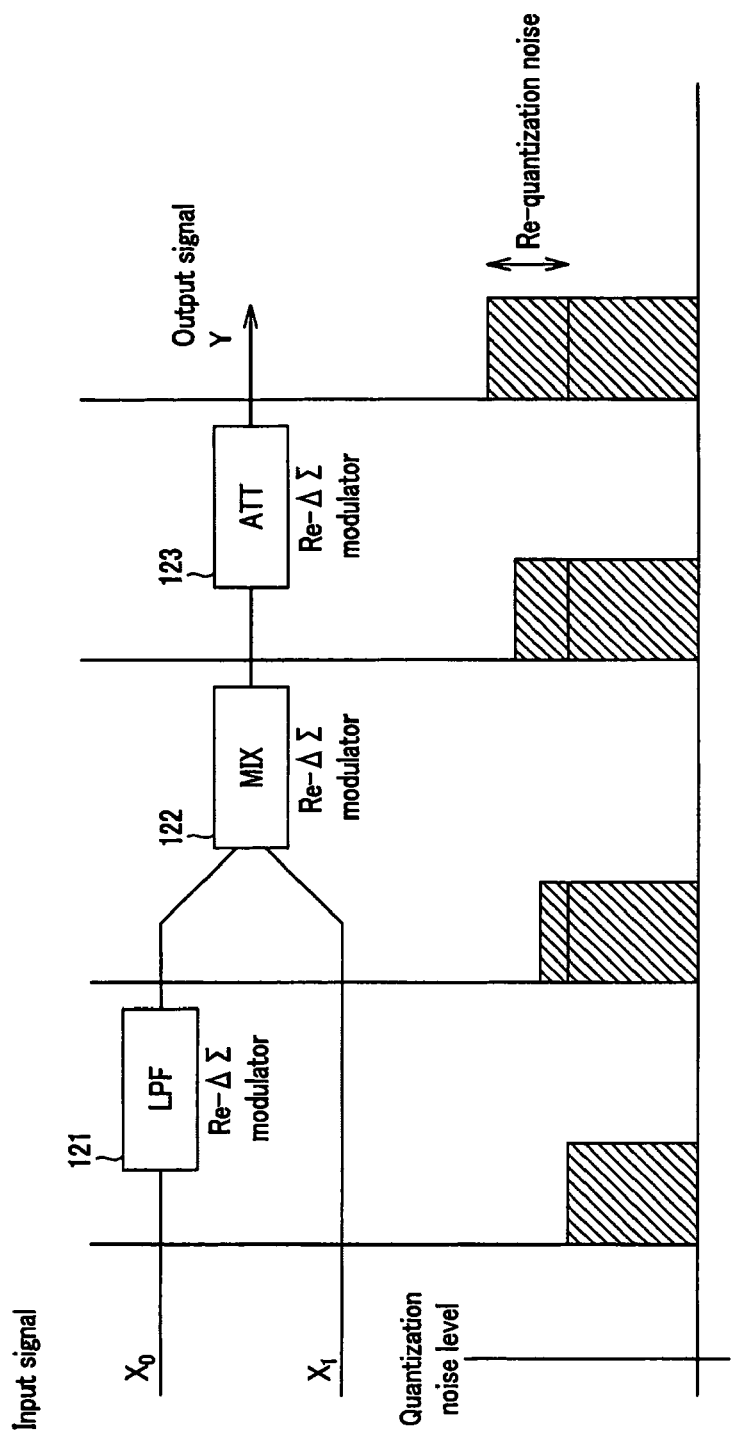
FIGS. 1A and 1B are views showing a structure of a conventional example of a digital signal processing apparatus and a quantization noise level.
Figure 2:
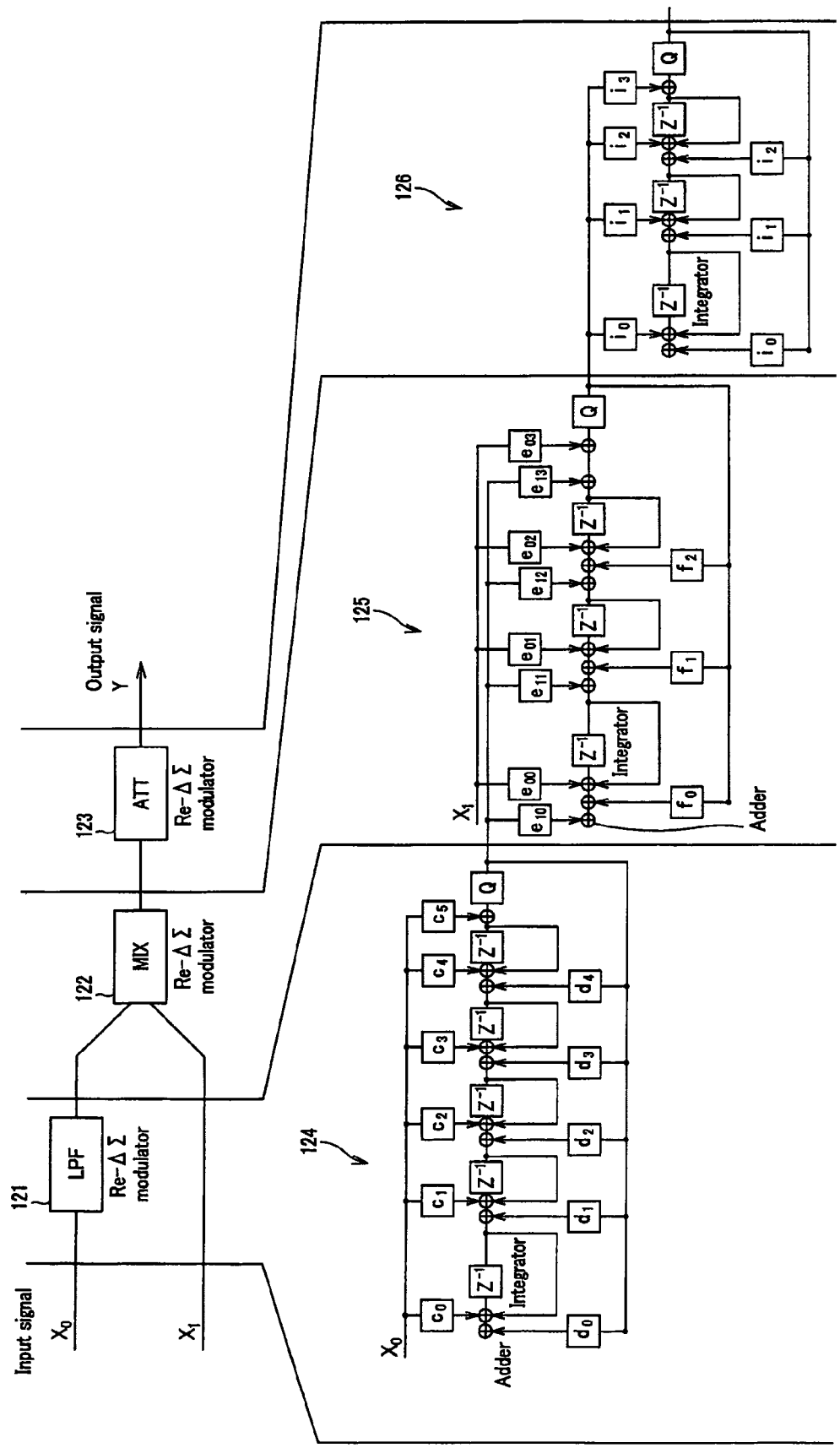
FIG. 2 is a view showing a structure of a delta sigma modulator corresponding to each section of the digital signal processing apparatus shown in FIG. 1.
Figures 3A, 3B:
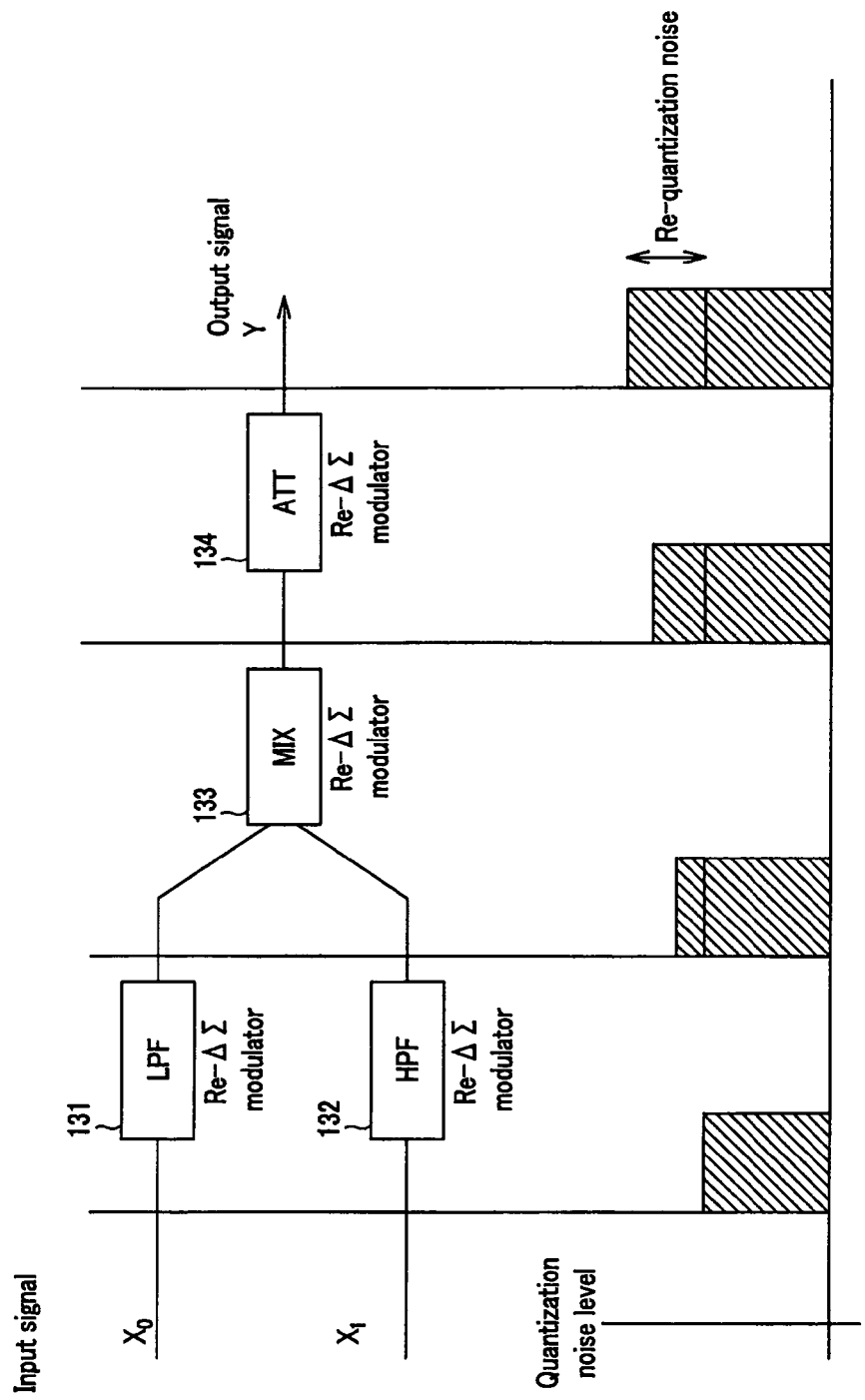
FIGS. 3A and 3B are views showing a structure of a conventional example of a digital signal processing apparatus and a quantization noise level.
Figures 4A, 4B:
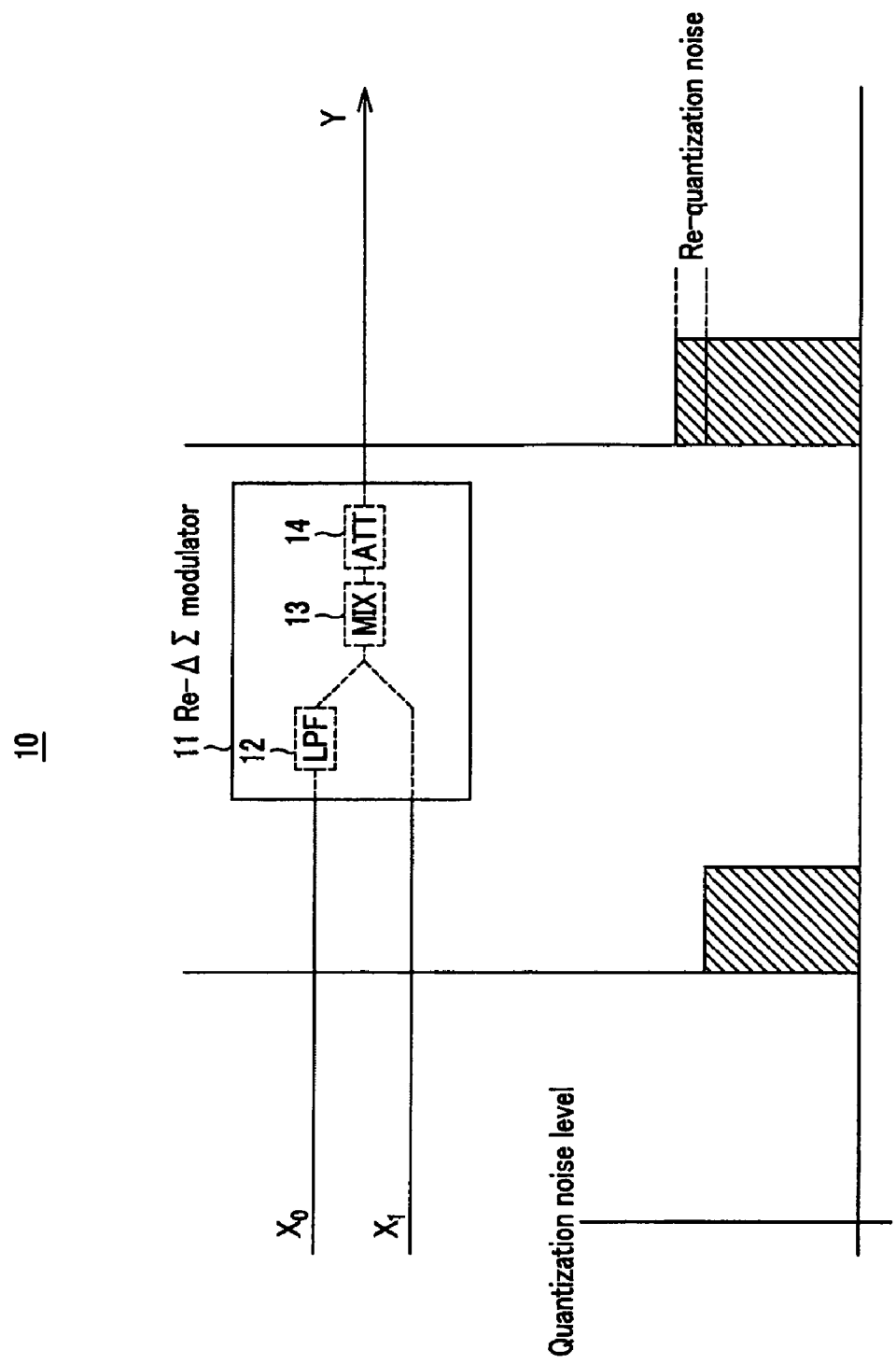
FIGS. 4A and 4B are views showing a structure of a digital signal processing apparatus of a first embodiment and a quantization noise level.

FIGS. 4A and 4B show the structure of a digital signal processing apparatus 10 of the first embodiment and the quantization noise level. A re-ΔΣ modulator 11 in FIG. 4A includes an LPF processor 12 for passing a low frequency component of the input signal $X_0$ of a 1-bit audio signal obtained by the ΔΣ modulation, a mixer (MIX) 13 for mixing the input signal $X_1$ of the 1-bit audio signal obtained by the ΔΣ modulation with the low frequency component of the input signal $X_0$ passed through the LPF processor 12, and an attenuator (ATT) 14 for controlling the gain of the mixed output by the mixer 13, and these filtering process, the mixing process and the attenuating process are performed by batch processing.

By adopting the structure shown in FIG. 4A, the digital signal processing apparatus 10 has the LPF function, the mixing function and the attenuating function in the re-ΔΣ modulator 11, can easily mix the inputs of the different frequency characteristics and easily control the gain even when the frequency characteristics of the filters are different and mixed.

Since the re-ΔΣ modulator 11 performs the LPF function, the mixing function and the attenuating function when re-quantized only once, the re-quantization noise is generated only once. Therefore, as shown in FIG. 4B, when the quantization noise level is observed, only one-time re-quantization noise is applied to the original quantization noise level incorporated in the input signal $X_1$ and the input signal $X_0$.

Therefore, the digital signal processing apparatus 10 can hold sufficiently high S/N ratio as compared with the prior art, and can ensure a higher tone quality. Furthermore, in the conventional digital signal processing apparatus, when the low frequency component of the input signal $X_0$ is mixed with the input signal $X_1$, the input signal $X_0$ is delayed by passing through the re-ΔΣ modulator. However, in the present invention, since the re-ΔΣ modulation process is performed at one time, the low frequency component of the input signal $X_0$ and the input signal $X_1$ are mixed and attenuated without delay.

Figure 5:
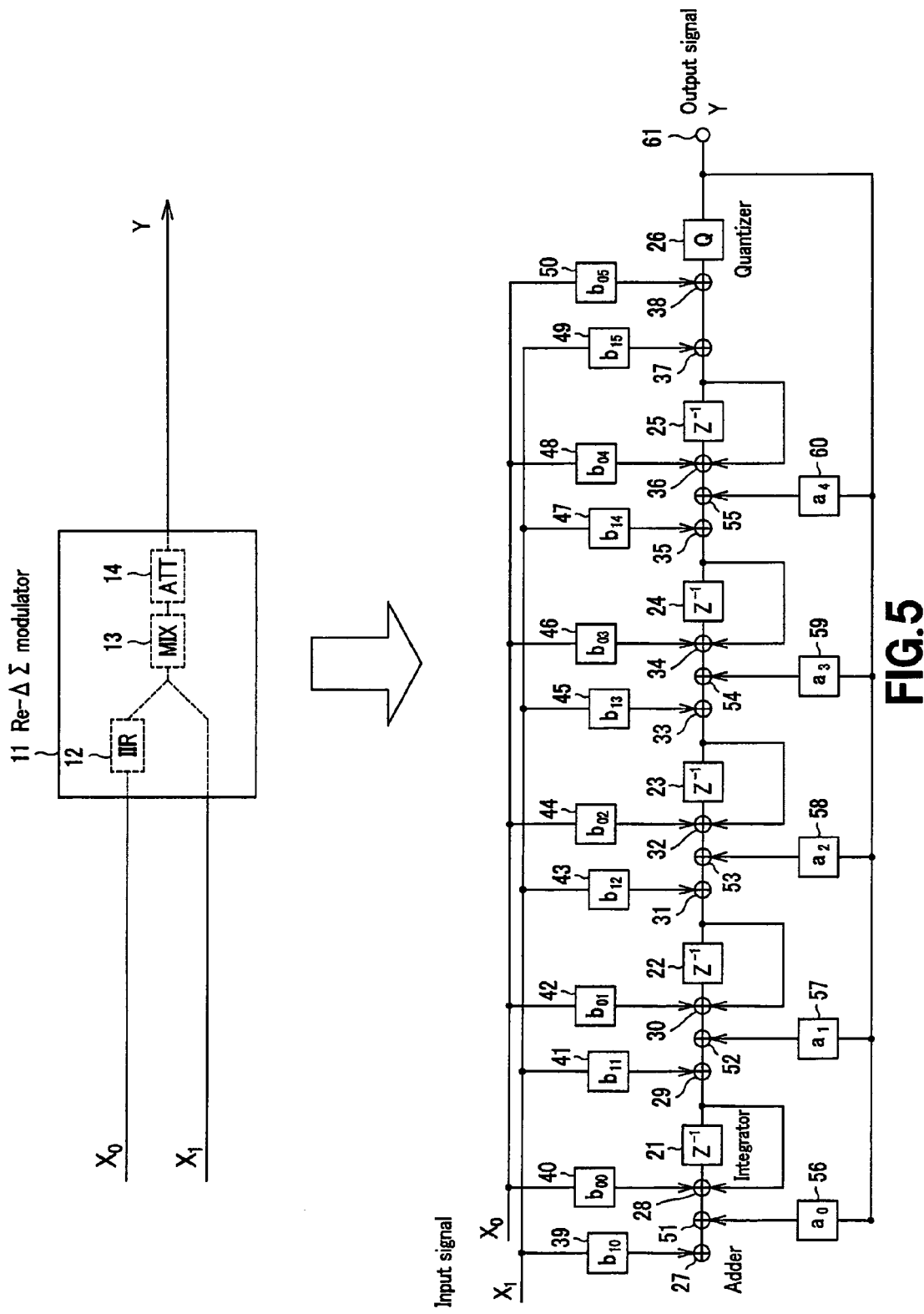
FIG. 5 is a structural view of an embodiment of a $\Delta\Sigma$ modulator of two systems input.

Hereinafter, the structure and the operation of the re-ΔΣ modulator 11 used in the digital signal processing apparatus 10, which structure is schematically shown in FIGS. 4A and 4B, will be described in detail. FIG. 5 is an embodiment of the ΔΣ modulator of the two systems input. This ΔΣ modulator 11 has coefficients defined by a secondary IIR filter section ($X_0$ system), a flat frequency characteristic ($X_1$ system) and a tertiary noise shaper.

The structure of this ΔΣ modulator 11 will be described. As shown in FIG. 5, the ΔΣ modulator 11 includes an integrating section having five integrators 21, 22, 23, 24 and 25 to be described later, and a quantizer 26 for quantizing the integrated output from the integrating section. The first two integrators 21 and 22 constitute a secondary IIR filter section. The integrators 23, 24 and 25 from the third stage to the last stage constitute a tertiary noise shaper.

Coefficient arithmetic units 39 to 50 of two feedforward systems for multiplying feedforward coefficients $b_{0i}$ (i is 0, 1, 2, 3, 4, and 5) and $b_{1i}$ (i is 0, 1, 2, 3, 4, and 5) of the two systems to be described later by two system input signals $X_0$ and $X_1$, and then inputting to the integrators 21 to 25 and the quantizer 26 through adders 27 to 38, respectively are disposed at the front stages of the five integrators 21 to 25 and the quantizer 26.

Furthermore, feedback system coefficient arithmetic units 56 to 60 for multiplying the feedback coefficient $a_i$ (i is 0, 1, 2, 3, and 4) of one system to be described later by the output of the quantizer 26 and then inputting to the integrators 21 to 25 through adders 51 to 55 are disposed at the front stages of the five integrators 21 to 25.

For example, the adders 27, 28 and 51 of the front stages of the first integrator 21 are disposed so that the adder 51 for adding the output of the coefficient arithmetic unit 56 obtained by multiplying a feedback coefficient $a_0$ by the output of the quantizer 26 is connected between the adder 27 for adding the output of the coefficient arithmetic unit 39 obtained by multiplying the feedforward coefficient $b_{10}$ by the input signal $X_1$ and the adder 28 for adding the output of the coefficient arithmetic unit 40 obtained by multiplying the feedforward coefficient $b_{00}$ by the input signal $X_0$, and become the sequence of the adders 27, 51, and 28. The disposition of the respective adders of the front stages up to the fifth integrator 25 is similar. The adder 38 for adding the output of the coefficient arithmetic unit 50 obtained by multiplying the feedforward coefficient $b_{05}$ by the input signal $X_0$ is connected to the adder 37 for adding the output of the coefficient arithmetic unit 49 obtained by multiplying the feedforward coefficient $b_{15}$ by the input signal $X_1$ at the front stage of the quantizer 26. Furthermore, the integrated outputs of the integrators 21 to 25 are returned to the input side through the respective adders 28, 30, 32, 34, and 36.

The coefficient arithmetic units 39 to 50 perform operations like filtering process, mixing process or gain controlling process on the two system input signals $X_0$ and $X_1$, and the feedforward coefficients $b_{0i}$, $b_{1i}$ for respective operation control process are loaded from an external memory as will be described.

The respective arithmetic outputs calculated by the feedforward coefficients $b_{0i}$, $b_{1i}$ to the two system input signals $X_0$ and $X_1$ by the coefficient arithmetic units 39 to 50 are supplied to the adders 27 to 36 of the respective integrators 21 to 25.

The quantizer 26 performs the quantization process at the added output of the adder 38, supplies the quantization output to the output terminal 61, and feeds back the quantization output to the coefficient arithmetic units 56 to 60.

The respective coefficient arithmetic units 56 to 60 load the feedback coefficient $a_i$ from the external memory as will be described when the quantized output is fed back to the respective integrators 21 to 25. The arithmetic outputs of the coefficient arithmetic units 56 to 60 are supplied to the adders 51 to 55 provided before the respective integrators 21 to 25, and fed back to the respective integrators.

Figure 6:
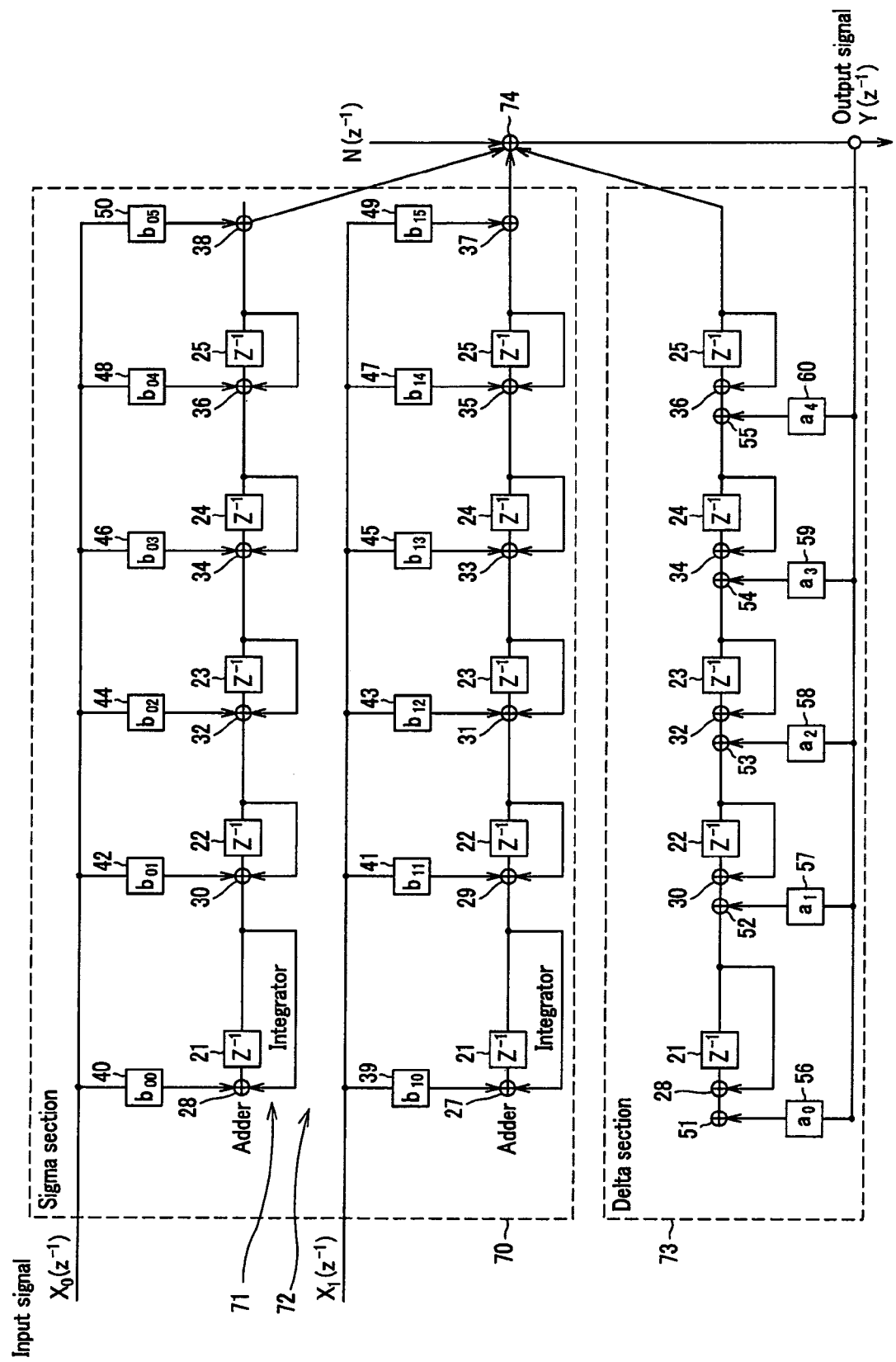
FIG. 6 is a view developing to a sigma section and a delta section.

Then, the transfer function from the structure of FIG. 5 to the input/output described as above will be obtained. More particularly, the structure of FIG. 5 is replaced with an approximately linear system, and input/output transfer functions in this system are obtained. When the inputs are $X_0(z^{-1})$, $X_1(z^{-1})$, the quantization noise is $N(z^{-1})$ and the output is $Y(z^{-1})$, the $\Delta\Sigma$ modulator shown in FIG. 5 can be considered to be divided into a sigma section 70 and a delta section 73 as shown in FIG. 6. In FIG. 6, the sigma section 70 includes a $\Sigma X_0$ system 71 passing an input $X_0(z^{-1})$, and a $\Sigma X_1$ system 72 passing the input $X_1(z^{-1})$.

The $\Sigma X_0$ system 71 includes the five integrators 21 to 25, the coefficient arithmetic units 40, 42, 44, 46, 48, and 50 for multiplying the feedforward coefficient $b_{0i}$ by the input $X_0(z^{-1})$, the adders 28, 30, 32, 34 and 36 for being supplied with the arithmetic outputs of the respective coefficient arithmetic units 40, 42, 44, 46, and 48, and the adder 38 for adding the arithmetic output of the coefficient arithmetic unit 50.

The $\Sigma X_1$ system 72 includes the five integrators 21 to 25, the coefficient arithmetic units 39, 41, 43, 45, 47 and 49 for multiplying the feed-forward coefficient $b_{1i}$ by the input $X_1(z^{-1})$, the adders 27, 29, 31, 33 and 35 for adding the arithmetic outputs of the respective coefficient arithmetic units 39, 41, 43, 45 and 47 to the integrators 21 to 25 and receiving the outputs of the respective integrators, and an adder 37 for adding the arithmetic output of the coefficient arithmetic unit 49.

Furthermore, the delta section 73 includes the five integrators 21 to 25, coefficient arithmetic units 56 to 60 for multiplying the feedback coefficient $a_i$ by the $\Sigma X_0$ system output 71, the $\Sigma X_1$ system output 72 supplied from the adder 74 to be described later and the quantization noise $N(z^{-1})$, and adders 51 to 55 for adding the arithmetic outputs of the respective coefficient arithmetic units 56 to 60 to the respective integrators 21 to 25 and receiving the outputs of the respective integrators. Further, the delta section 73 also includes adders 28, 30, 32, 34 and 36 receiving the outputs of the respective integrators 21 to 25. The delta section 73 is supplied with the $\Sigma X_0$ system output 71, the $\Sigma X_1$ system output 72 through the adder 74 and the quantization noise $N(z^{-1})$.

When the above-mentioned structure is summarized, the input $X_0(z^{-1})$ and the input $X_1(z^{-1})$ are passed through both the sigma section 70 and the delta section 73, but the $N(z^{-1})$ of the quantization noise is passed only through the delta section 73. Therefore, the following equation (1) is satisfied.

[Equation 1]

$$Y(z^{-1}) = \frac{g_{00}z^{-5} + g_{01}z^{-4} + g_{02}z^{-3} + g_{03}z^{-2} + g_{04}z^{-1} + g_{05}}{h_0z^{-5} + h_1z^{-4} + h_2z^{-3} + h_3z^{-2} + h_4z^{-1} + 1} \times X_0(z^{-1}) + \frac{g_{10}z^{-5} + g_{11}z^{-4} + g_{12}z^{-3} + g_{13}z^{-2} + g_{14}z^{-1} + g_{15}}{h_0z^{-5} + h_1z^{-4} + h_2z^{-3} + h_3z^{-2} + h_4z^{-1} + 1} \times X_1(z^{-1}) + \frac{(z-1)^{-5}}{h_0z^{-5} + h_1z^{-4} + h_2z^{-3} + h_3z^{-2} + h_4z^{-1} + 1} \times N(z^{-1}) \quad (1)$$

Figure 7:
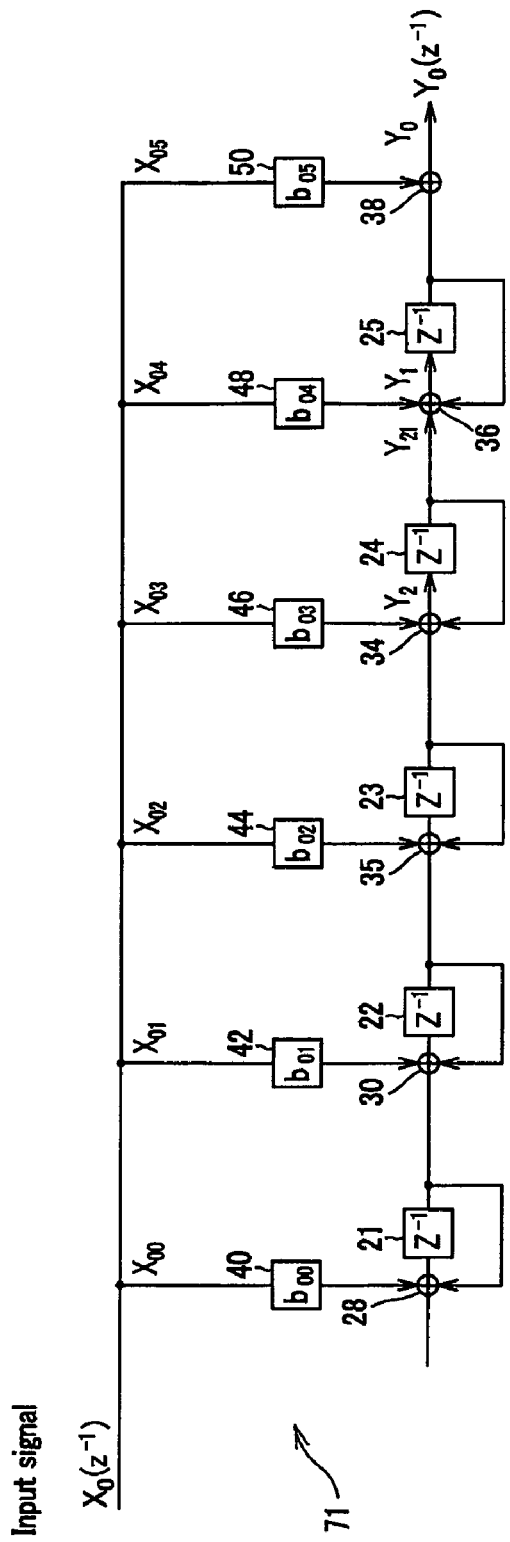
FIG. 7 is an input/output block diagram of the sigma section in $X_0(z^{-1})$.

Referring to the input/output block of the sigma section 70 in the $X_0(z^{-1})$ shown in FIG. 7, the transfer function from the input to output will be described with respect to the $\Sigma X_0$ system, that is, the input $X_0(z^{-1})$ system of the sigma section 70. When the input system is considered by dividing into $x_{00}$ to $x_{05}$, the transfer function $H_{s0}(z^{-1})$ in the $X_0(z^{-1})$ is placed as the following equation (2).

[Equation 2]

$$H_{s0}(z^{-1}) = \frac{Y_0(z^{-1})}{X_0(z^{-1})} = H_{x05 \to y0}(z^{-1}) + H_{x04 \to y0}(z^{-1}) + H_{x03 \to y0}(z^{-1}) + H_{x02 \to y0}(z^{-1}) + H_{x01 \to y0}(z^{-1}) + H_{x00 \to y0}(z^{-1}) \quad (2)$$

However, for example, $H_{x05 \to y0}(z^{-1})$ means the transfer function to $x_{05} \to y_0$. $H_{x04 \to y0}(z^{-1})$ means the transfer function to $x_{04} \to y_0$. Similarly, $H_{x01 \to y0}(z^{-1})$ means the transfer function to $x_{01} \to y_0$.

Then, when the respective transfer functions are sequentially guided, first the transfer function to $x_{05} \to y_0$ becomes the following equation (3).

[Equation 3]

$$H_{x05 \to y0}(z^{-1}) = b_{05} \quad (3)$$

Figure 8:
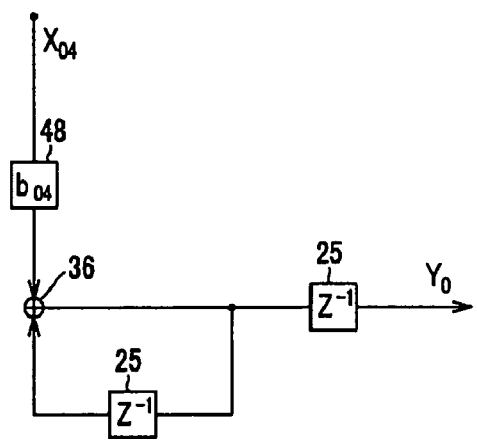
FIG. 8 is a block diagram showing the structure to $x_{04} \rightarrow y_0$.

Furthermore, $x_{04}$ becomes as in a block diagram of FIG. 8. That is, the feedforward coefficient $b_{04}$ is multiplied by the input $X_0(z^{-1})$ by the coefficient arithmetic unit 48, inputted to the integrator 25 through the adder 36, and returned to the adder 36. Therefore, the transfer function $H_{x04 \to y0}(z^{-1})$ to $x_{04} \to y_0$ becomes as the following equation (4).

[Equation 4]

$$H_{x04 \to y0}(z^{-1}) = \frac{b_{04}z^{-1}}{(1-z^{-1})^{-1}} \quad (4)$$

Figure 9:
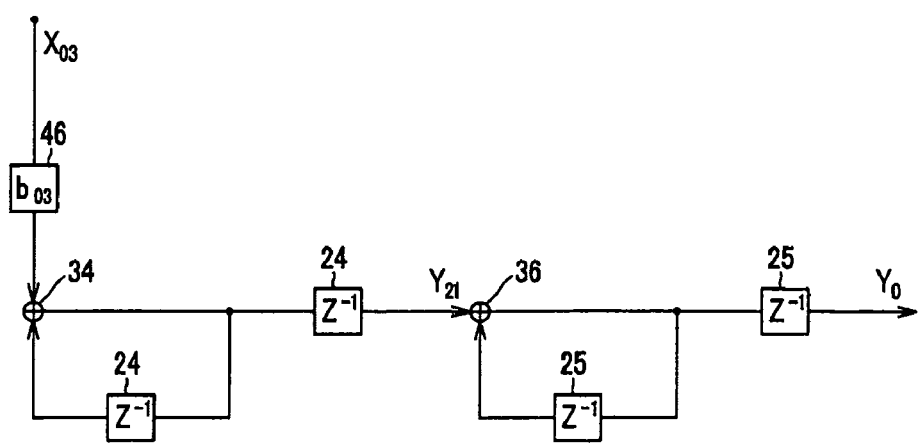
FIG. 9 is a block diagram showing the structure to $x_{03} \rightarrow y_0$.

Similarly, $x_{03}$ becomes as shown in FIG. 9. That is, a feedforward coefficient $b_{03}$ is multiplied by the input $X_0(z^{-1})$ via the coefficient arithmetic unit 46, inputted to the integrator 24 through the adder 34, returned to the adder 34, further inputted to the integrator 25 through the adder 36, and returned to the adder 36. Therefore, the transfer function $Hx_{03 \to y0}(z^{-1})$ to $x_{03} \to y_0$ becomes the following equation (5).

[Equation 5]

$$H_{x03 \to y0}(z^{-1}) = \frac{b_{03}z^{-2}}{(1-z^{-1})^{-2}} \quad (5)$$

Hereinafter, the transfer function $H_{x02 \to y0}(z^{-1})$ to $x_{02} \to y_0$, the transfer function $H_{x01 \to y0}(z^{-1})$ to $x_{01} \to y_0$, and the transfer function $H_{x00 \to y0}(z^{-1})$ to $x_{00} \to y_0$ respectively become equations (6), (7) and (8).

[Equation 6]

$$H_{x02 \to y0}(z^{-1}) = \frac{b_{02}z^{-3}}{(1-z^{-1})^{-3}} \quad (6)$$

-continued

[Equation 7]

$$H_{xo1 \to yo}(z^{-1}) = \frac{b_{01}z^{-4}}{(1-z^{-1})^{-4}} \quad (7)$$

[Equation 8]

$$H_{xo0 \to yo}(z^{-1}) = \frac{b_{00}z^{-5}}{(1-z^{-1})^{-5}} \quad (8)$$

When the transfer functions of the above equations (3) to (8) are substituted for the equation (2), the following equation (9) is obtained.

[Equation 9]

$$Y_0(z^{-1}) = \left\{ b_{05} \frac{b_{04}z^{-1}}{(1-z^{-1})^{-1}} + \frac{b_{03}z^{-2}}{(1-z^{-1})^{-2}} + \frac{b_{02}z^{-3}}{(1-z^{-1})^{-3}} + \frac{b_{01}z^{-4}}{(1-z^{-1})^{-4}} + \frac{b_{00}z^{-5}}{(1-z^{-1})^{-5}} \right\} \times X_0(z^{-1}) \quad (9)$$

Here, in the equation (9), when $Y(z^{-1}) = \{H_{b0}(z^{-1})/(1-z^{-1})^{-5}\} \times X_0(z^{-1})$ is placed, the following equation (10) is obtained.

[Equation 10]

$$H_{b0}(z^{-1}) = b_{05} + (b_{04} - 5b_{05})z^{-1} + \quad (10)$$
$$(b_{03} - 4b_{04} + 10b_{05})z^{-2} + (b_{02} - 3b_{03} - 6b_{04} - 10b_{05})z^{-3} +$$
$$(b_{01} - 2b_{02} + 3b_{03} - 4b_{04} + 5b_{05})z^{-4} +$$
$$(b_{00} - b_{01} + b_{02} - b_{03} + b_{04} - b_{05})z^{-5}$$

Similarly, when the transfer function $H_{S1}(z^{-1}) = \{H_{b0}(z^{-1})/(1-z^{-1})^{-5}\}$ in the $X_1(z^{-1})$ is placed, the following equation (11) is obtained.

[Equation 11]

$$H_{b1}(z^{-1}) = b_{15} + (b_{14} - 5b_{15})z^{-1} + \quad (11)$$
$$(b_{13} - 4b_{14} + 10b_{15})z^{-2} + (b_{12} - 3b_{13} - 6b_{14} - 10b_{15})z^{-3} +$$
$$(b_{11} - 2b_{12} + 3b_{13} - 4b_{14} + 5b_{15})z^{-4} +$$
$$(b_{10} - b_{11} + b_{12} - b_{13} + b_{14} - b_{15})z^{-5}$$

Figure 10:
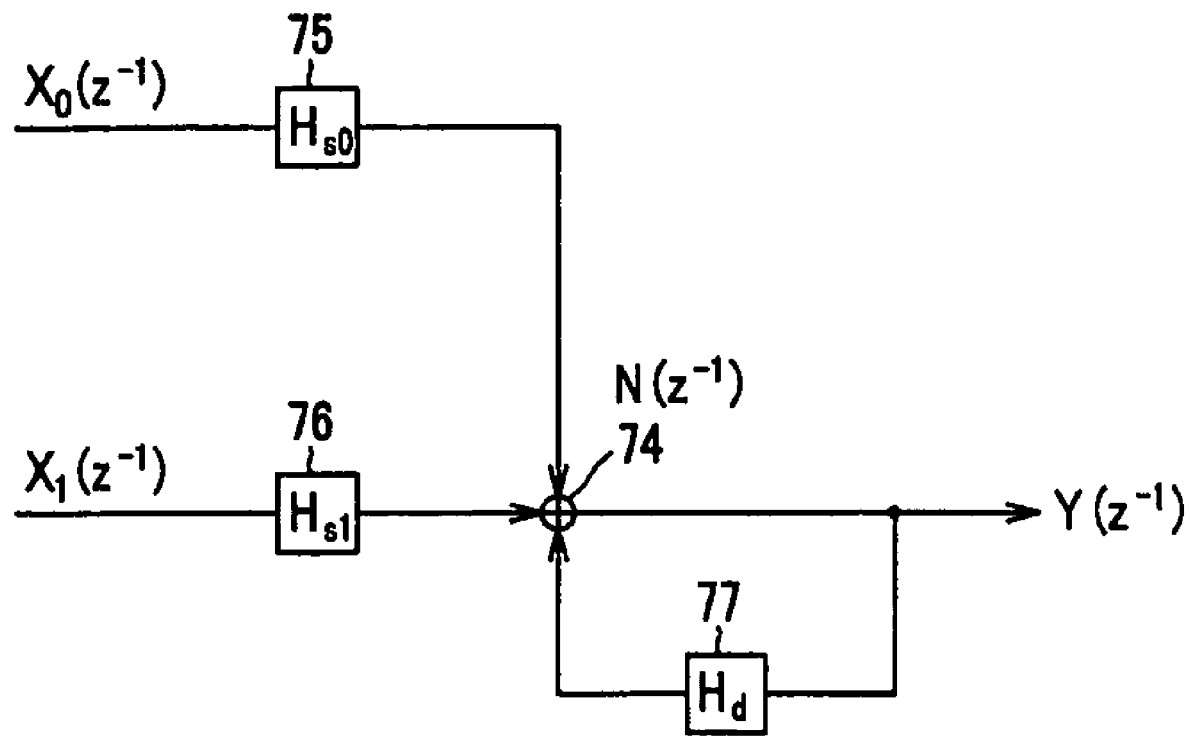
FIG. 10 is a view explaining the transfer function $H_d$ of the delta section.

On the other hand, the transfer function $H_A(z^{-1})$ of the quantization noise $N(z^{-1})$ is transfer function $H_{s0}$ of the input $X_0(z^{-1})$ system, the transfer function $H_{s1}$ of the $\Sigma X_1$ system 72, and the transfer function $H_d$ of the delta section based on the structure for giving the transfer function shown in FIG. 10, and, accordingly, becomes $H_A(z^{-1}) = 1/(1-H_d(z^{-1}))$. FIG. 10 shows the structure for giving the transfer function to the respective inputs by the coefficient arithmetic units 75, 76 and 77.

From FIG. 6 and FIG. 10, since the relationship between the $H_d(z^{-1})$ and the $H_{s0}(z^{-1})$ is equivalent to the circuit of $b_{05}=0$ when $b_{00}$ to $b_{04}$ and the $a_0$ to $a_4$ are replaced, and the following equation (12) is obtained.

[Equation 12]

$$H_\Delta(z^{-1}) = \frac{1}{1 - H_{s0}(z^{-1})} = \frac{(1-z^{-1})^{-5}}{(1-z^{-1})^{-5} - H_{b0}(z^{-1})} \quad (12)$$

Moreover, when the denominator of the $H_A(z^{-1})$ is replaced with $H_{a0}(z^{-1})$, the following equation (13) is obtained.

[Equation 13]

$$H_{a0}(z^{-1}) = \quad (13)$$
$$1 - (-5 - a_4)z^{-1} + (10 - a_3 + 4a_4)z^{-2} + (-10 - a_2 + 3a_3 - 6a_4)z^{-3} +$$
$$(5 - a + 2a_3 - 3a_4 + 4a_4)z^{-4} + (1 - a_0 + a_1 - a_2 + a_3 - a_4)z^{-5}$$

In order to know the relationship between $g_{00}$ to $g_{05}$, $g_{10}$ to $g_{15}$, $h_0$ to $h_4$ and $b_{00}$ to $b_{05}$, $b_{10}$ to $b_{15}$, and $a_0$ to $a_4$ from the foregoing description, the coefficients of the polynominal of z are compared from the equations (1), (9), (10) and (13), the following equations (14), (15) and (16) are obtained.

[Equation 14] (14)

$$\begin{cases} g_{05} = b_{05} \\ g_{04} = b_{04} - 5b_{05} \\ g_{03} = b_{03} - 4b_{04} + 10b_{05} \\ g_{02} = b_{02} - 3b_{03} - 6b_{04} - 10b_{05} \\ g_{01} = b_{01} - 2b_{02} + 3b_{03} - 4b_{04} + 5b_{05} \\ g_{00} = b_{00} - b_{01} + b_{02} - b_{03} + b_{04} - b_{05} \end{cases}$$

[Equation 15] (15)

$$\begin{cases} g_{15} = b_{15} \\ g_{14} = b_{14} - 5b_{15} \\ g_{13} = b_{13} - 4b_{14} + 10b_{15} \\ g_{12} = b_{12} - 3b_{13} - 6b_{14} - 10b_{15} \\ g_{11} = b_{11} - 2b_{12} + 3b_{13} - 4b_{14} + 5b_{15} \\ g_{10} = b_{10} - b_{11} + b_{12} - b_{13} + b_{14} - b_{15} \end{cases}$$

[Equation 16] (16)

$$\begin{cases} h_4 = -5 - a_4 \\ h_3 = 10 - a_3 + 4a_4 \\ h_2 = -10 - a_2 + 3a_3 - 6a_4 \\ h_1 = 5 - a + 2a_3 - 3a_4 + 4a_4 \\ h_0 = 1 - a_0 + a_1 - a_2 + a_3 - a_4 \end{cases}$$

From the results of the above equations (14), (15) and (16), if $g_{00}$ to $g_{05}$, $g_{10}$ to $g_{15}$, $h_0$ to $h_4$ in the equation (1) of the input/output transfer functions of the approximately placed linear system can be obtained, the feedforward coefficients $b_{00}$ to $b_{05}$, $b_{10}$ to $b_{15}$, and the feedback coefficients $a_0$ to $a_4$ of the arithmetic coefficients of FIG. 4A can be guided.

From here, a method of guiding the coefficient calculation is shown based on the actual structure specification.

In the structure shown in FIG. 5, the inputs $X_0(z^{-1})$, $X_1(z^{-1})$ of the system having the characteristics of a secondary IIR filter in the frequency characteristics in $X_0(z^{-1})$ of the input as the specification and of the system (FLAT Xtype) having no frequency characteristics of the secondary IIR filter in $X_1(z^{-1})$ are mixed, and the gain control is simultaneously conducted. In order to realize the secondary IIR filter, when the transfer function of the secondary IIR filter is set to $H_{iir}(z^{-1})$, the following equation (17) is obtained.

[Equation 17]

$$H_{iir}(z^{-1}) = \frac{r_0 + r_1 z^{-1} + r_2 z^{-2}}{1 + s_1 z^{-1} + s_2 z^{-2}} \quad (17)$$

Furthermore, to realize a tertiary noise shaper, when the transfer function of the tertiary noise shaper is set to $H_{ns}(z^{-1})$, the following equation (18) is obtained.

[Equation 18]

$$H_{ns}(z^{-1}) = \frac{(1-z^{-1})^{-3}}{(1 + p_1 z^{-1} + p_2 z^{-2})(1 - p_3 z^{-1})} \quad (18)$$

The operation becomes unstable when the high frequency component of the signal inputted from the input signal, such as $X_0(z^{-1})$, $X_1(z^{-1})$, etc., is taken in the delta sigma section. When the transfer characteristics of the cascade LPF filter used to remove the high frequency component is set to $H_{cas}(z^{-1})$, the following equation (19) is obtained.

[Equation 19]

$$H_{cas}(z^{-1}) = (1+z^{-1})^{-3} \quad (19)$$

In the frequency characteristics of the LPF filter in $X_0(z^{-1})$ of one of the inputs, the relationships between FIG. 4A and the IIR filter characteristics, the noise shaper characteristics, cascade LPF filter characteristics are considered. In the sigma section 70 of FIG. 6, to realize the zero point in the characteristics of the cascade LPF filter and the IIR filter, the coefficients $g_{00}$ to $g_{05}$ which satisfy the following equation (20) may be guided.

[Equation 20]

$$(1+z^{-1})^{-3}(r_0 + r_1 z^{-1} + r_2 z^{-2}) = g_{05} + g_{04} z^{-1} + g_{03} z^{-2} + g_{02} z^{-3} + g_{01} z^{-4} + g_{00} z^{-5} \quad (20)$$

Furthermore, to realize the pole in the characteristics of the noise shaper and the IIR filter from the delta section 73 of FIG. 6, the coefficients $h_0$ to $h_4$ which satisfy the following equation (21) may be guided.

[Equation 21]

$$(1 + p_1 z^{-1} + p_2 z^{-2})(1 - p_3 z^{-1})(1 + s_1 z^{-1} + s_2 z^{-2}) = 1 + h_4 z^{-1} + h_3 z^{-2} + h_2 z^{-3} + h_1 z^{-4} + h_0 z^{-5} \quad (21)$$

On the other hand, in the frequency characteristics in $X_1(z^{-1})$, in order not to give the frequency characteristics of the IIR filter (to flatten the frequency characteristics), it should satisfy $H_{iir}(z^{-1}) = (r_0 + r_1 z^{-1} + r_2 z^{-2})/(1 + s_1 z^{-1} + s_2 z^{-2}) = 1$. In order to realize one delta sigma modulation, since it should have a delta section similar to $X_0(z^{-1})$ in the system in $X_1(z^{-1})$, the coefficients $g_{10}$ to $g_{15}$ which satisfy the following equation (22) may be guided.

[Equation 22]

$$(1+z^{-1})^{-3}(1 + s_1 z^{-1} + s_2 z^{-2}) = g_{15} + g_{14} z^{-1} + g_{13} z^{-2} + g_{12} z^{-3} + g_{11} z^{-4} + g_{10} z^{-5} \quad (22)$$

Moreover, when the mixing and the gain control are conducted, the mixing value in $X_0(z^{-1})$ is $M_0$, the mixing value in $X_1(z^{-1})$ is $M_1$, and the gain of the gain control is K. Then, the coefficients becoming $KM_0 g_{00}$ to $KM_0 g_{05}$, $KM_1 g_{10}$ to $KM_1 g_{15}$ multiplied by the coefficients $g_{00}$ to $g_{05}$, $g_{10}$ to $g_{15}$ may be used instead of the $g_{00}$ to $g_{05}$, $g_{10}$ to $g_{15}$.

According to the above coefficient guiding method, a delta sigma modulator having a coefficient which mixes the inputs $X_0(z^{-1})$, $X_1(z^{-1})$ of the system having the characteristics of the secondary IIR filter in the frequency characteristics in $X_0(z^{-1})$ of the input and of the system (FLAT type) having no frequency characteristics of the secondary IIR filter in $X_1(z^{-1})$, and simultaneously realizes the gain control, is realized.

Subsequently, a second embodiment will be described. The second embodiment is also a digital signal processing apparatus including a re-$\Delta\Sigma$ modulator for incorporating different frequency characteristics in a plurality or, for example, two input signals $X_0$ and $X_1$ obtained by the delta sigma ($\Delta\Sigma$) modulation, mixing the two input signals $X_0$ and $X_1$, further controlling the gain simultaneously, and performing the re-$\Delta\Sigma$ modulation process.

Figures 11A, 11B:
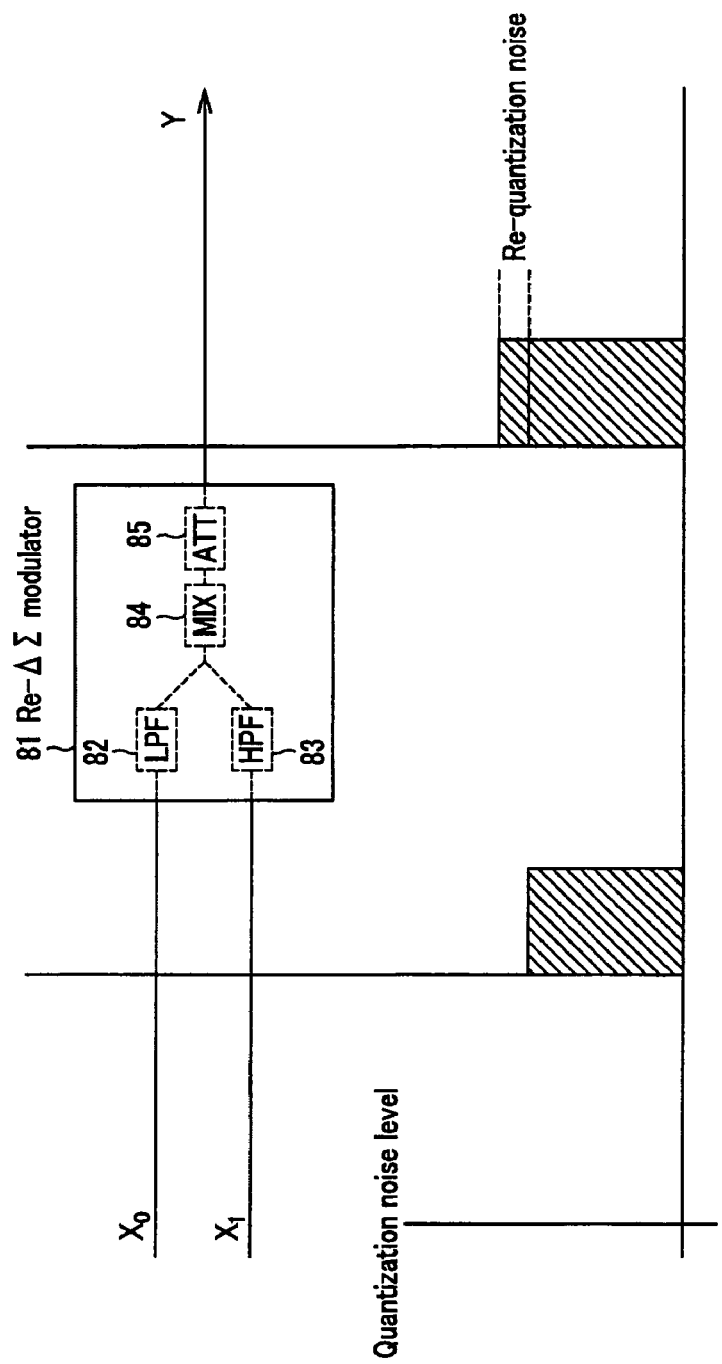
FIGS. 11A and 11B are views showing the structure of a digital signal processing apparatus of a second embodiment and a quantization noise level.

In FIGS. 11A and 11B, the structure of a digital signal processing apparatus 80 of the second embodiment and a quantization noise level are shown. A re-$\Delta\Sigma$ modulator 81 includes an LPF 82 for passing the low frequency component of an input signal $X_0$ of a 1-bit audio signal obtained by a $\Delta\Sigma$ modulation, an HPF 83 for passing the high frequency component of an input signal $X_1$ of a 1-bit audio signal obtained by the $\Delta\Sigma$ modulation, a mixer (MIX) 84 for mixing the low frequency component of the input signal $X_0$ passed through the LPF 82 with the high frequency component of the input signal $X_1$ passed through the HPF 83, and an attenuator (ATT) 85 for controlling the gain of the mixed output by the mixer 84, and these filtering process, the mixing process and the attenuating process are performed by batch processing.

By adopting the structure shown in FIG. 11A, the digital signal processing apparatus 80 of the second embodiment has the LPF function, the HPF function, the mixing function, and the attenuating function in the re-$\Delta\Sigma$ modulator 81. Even if the frequency characteristics of the filter are different from each other for the plurality of the inputs and are mixed, the inputs having the different frequency characteristics are easily mixed, and the gain can be easily controlled.

Since the re-$\Delta\Sigma$ modulator 81 performs the LPF function, the HPF function, the mixing function and the attenuating function in the case of only one time re-quantization, the re-$\Delta\Sigma$ modulator 81 generates a re-quantization noise only once. As shown in FIG. 11B, when a re-quantization noise level is observed, only the one time re-quantization noise is added to the original quantization noise level incorporated in the input signal $X_1$ or the input signal $X_0$.

Therefore, the digital signal processing apparatus 80 can hold sufficiently high S/N ratio as compared with prior art and can ensure higher tone quality.

Figure 12:
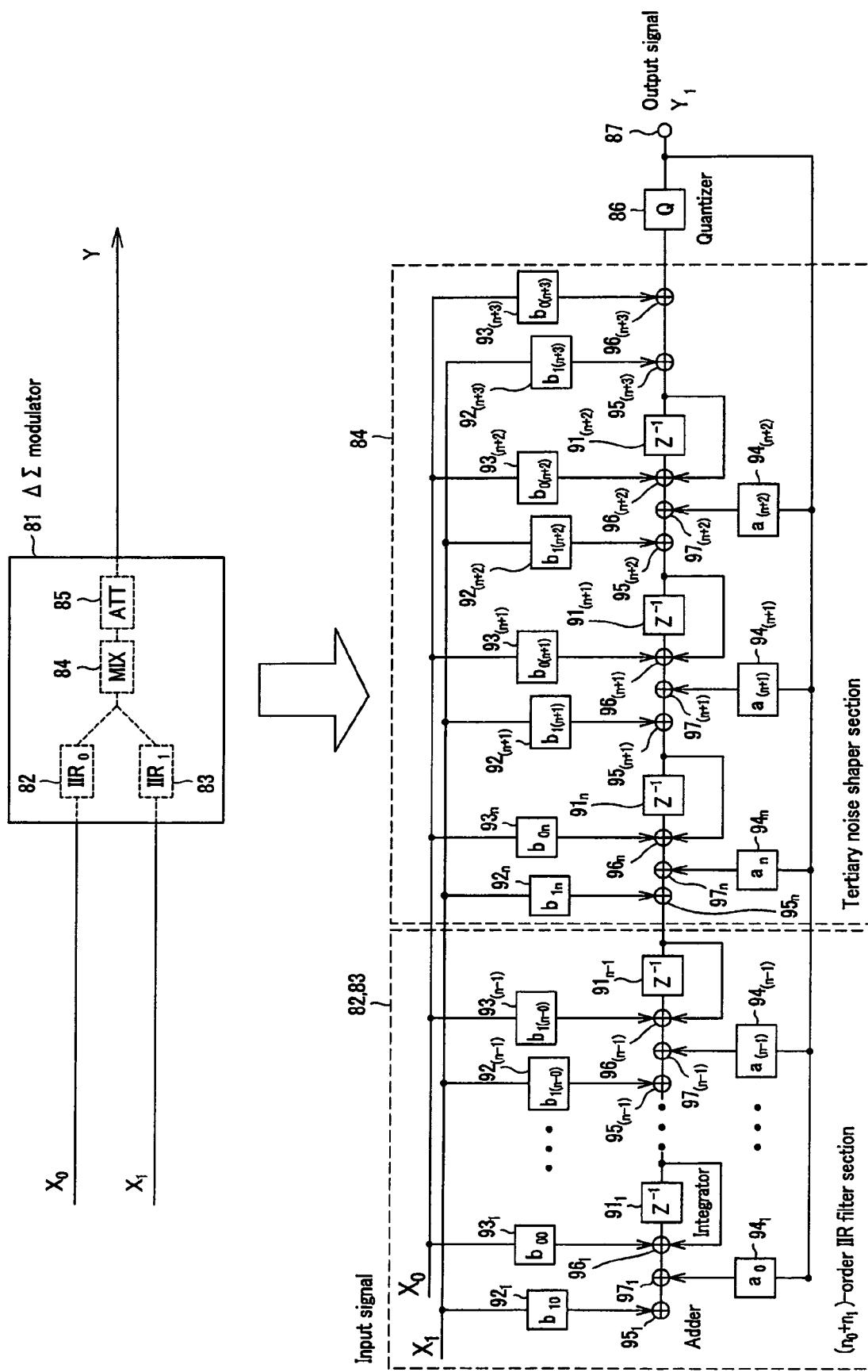
FIG. 12 is a view showing an embodiment of the ΔΣ modulator of the two input systems.

The structure and the operation of the $\Delta\Sigma$ modulator 81 used in the digital signal processing apparatus 80 schematically shown in FIG. 11A will be described in detail. FIG. 12 shows an embodiment of a $\Delta\Sigma$ modulator of the inputs of two systems. This $\Delta\Sigma$ modulator 81 has a coefficient defined by an $n_0$-order IIR filter section 82 ($X_0$ system) for constituting an LPF, an $n_1$-order IIR filter section 83 ($X_1$ system) for constituting an HPF, and a tertiary noise shaper 84.

The structure of this $\Delta\Sigma$ modulator 81 will be described. As shown in FIG. 12, two feedforward system coefficient arithmetic units $92_1$ to $92_{(n-1)}$ and $93_1$ to $93_{(n-1)}$ for multiplying two-system feed-forward coefficients $b_{00}$ to $b_{(n-1)}$ and $b_{10}$ to $b_{1(n-1)}$ by two-system input signals $X_0$ and $X_1$ and then inputting the product to respective integrators through adders $95_1$ to $95_{(n-1)}$ and $96_1$ to $96_{(n-1)}$ are disposed at the front stages of $(n_0+n_1)$ pieces of the integrators $91_1$ to $9_{1(n-1)}$ incorporated in the $(n_0+n_1)$-order IIR filter sections 82, 83.

Furthermore, two feedforward system coefficient arithmetic units $92_n$ to $92_{(n+2)}$ and $93_n$ to $93_{(n+2)}$ for multiplying two-system feedforward coefficients $b_{0n}$ to $b_{0(n+3)}$ and $b_{1n}$ to $b_{1(n+3)}$ by two-system input signals $X_0$ and $X_1$ and then inputting the product to respective integrators through adders $95_n$ to $95_{(n+2)}$ and $96_n$ to $96_{(n+2)}$ are disposed at the front stages of three integrators $91_n$, $91_{(n+1)}$, and $91_{(n+2)}$ incorporated in the tertiary noise shaper 84.

Moreover, feedback system coefficient arithmetic units $94_1$ to $94_{(n-1)}$, $94_n$ to $94_{(n+2)}$ for multiplying one system feedback coefficient $a_0$ to $a_{(n+2)}$ by the output of a quantizer 86 and then inputting the product to the respective integrators through the adders are disposed at the front stages of the filter sections 82, 83 and the integrators of the noise shaper 84.

In the $\Delta\Sigma$ modulator 81 of the structure shown in FIG. 11A, the frequency characteristics in the $X_0(z^{-1})$ of the input have the characteristics of an $n_0$-order IIR filter. On the other hand, in the $X_1(z^{-1})$, the frequency characteristics of the $n_1$-order IIR filter are provided. The coefficient arithmetic method in the case of mixing the inputs $X_0(z^{-1})$, $X_1(z^{-1})$ can be described as below.

When the transfer characteristics of the $n_0$-order IIR filter 82 to be realized this time are $H_{i0}(z^{-1})$, and the transfer characteristics of the $n_1$-order IIR filter 83 is $H_{i1}(z^{-1})$, these transfer characteristics become the following equation (23).

[Equation 23] (23)

$$\begin{cases} H_{i0}(z^{-1}) = \dfrac{\sum_{k=0}^{k=n_0} r_k z^{-k}}{1 + \sum_{k=1}^{k=n_0} s_k z^{-k}} \\ H_{i1}(z^{-1}) = \dfrac{\sum_{k=0}^{k=n_1} t_k z^{-k}}{1 + \sum_{k=1}^{k=n_1} u_k z^{-k}} \end{cases}$$

Furthermore, when the noise shaper desired to be realized has the characteristics of a tertiary noise shaper like the equation (18), the transfer characteristics become the following equation (24).

[Equation 24] (24)

$$H_{ns}(z^{-1}) = \frac{(1-z^{-1})^{-3}}{(1+p_1 z^{-1}+p_2 z^{-2})(1-p_3 z^{-1})}$$

Further, the transfer characteristics $H_{cas}(z^{-1})$ of the cascade LPF filter, similarly becomes the following equation (25).

[Equation 25]

$$H_{cas}(z^{-1}) = (1+z^{-1})^{-3} \qquad (25)$$

For realizing with one delta sigma modulator, since only the delta section is incorporated commonly in any of both, to realize the poles of the characteristics of the noise shaper 84 and two IIR filters 82, 83, the coefficient $h_k\{0 \leq k \leq (n_0+n_1+2)\}$ for satisfying the following equation (26) may be guided.

[Equation 26] (26)

$$(1+p_1 z^{-1}+p_2 z^{-2})(1-p_3 z^{-1})\left(1+\sum_{k=1}^{k=n_0} s_k z^{-k}\right)\left(1+\sum_{k=1}^{k=n_1} u_k z^{-k}\right) = $$
$$1 + \sum_{k=1}^{k=n_0+n_1+3} h_{n_0+n_1+3-k} z^{-k}$$

Furthermore, in $X_0(z^{-1})$, to realize by canceling the terms of the zero point in the characteristics of the cascade LPF filter and the no-order IIR filter 82 and the pole of the $n_1$-order IIR filter 83 characteristics of the delta section, the sigma section may guide the coefficient $g_{0k}\{0 \leq k \leq (n_0+n_1+3)\}$ which satisfies the following equation (27).

[Equation 27] (27)

$$(1+z^{-1})^{-3}\left(\sum_{k=0}^{k=n_0} r_k z^{-k}\right)\left(1+\sum_{k=1}^{k=n_1} u_k z^{-k}\right) = \sum_{k=0}^{k=n_0+n_1+3} g_{0[n_0+n_1+3-k]} z^{-k}$$

Similarly, in $X_1(z^{-1})$, to realize by canceling the terms of the zero point in the characteristics of the cascade LPF filter and the $n_1$-order IIR filter and the pole of the $n_0$-order IIR filter characteristics of the delta section, the sigma section may guide the coefficient $g_{1k}\{0 \leq k \leq (n_0+n_1+3)\}$ which satisfies the following equation (28).

[Equation 28] (28)

$$(1+z^{-1})^{-3}\left(\sum_{k=0}^{k=n_0} t_k z^{-k}\right)\left(1+\sum_{k=1}^{k=n_1} s_k z^{-k}\right) = \sum_{k=0}^{k=n_0+n_1+3} g_{1[n_0+n_1+3-k]} z^{-k}$$

As described above, in first embodiment and the second embodiment, the method capable of mixing the plurality of the signals by gain controlling the plurality of the inputs having different frequency characteristics in one delta sigma modulators 11, 81 of the plurality of the inputs has been described.

As described in the first embodiment, when one type of the frequency characteristics are incorporated in the plurality of the inputs and the frequency characteristics are flat for the other input, the number of orders of the delta sigma which can be realized may be the sum of the number of orders of the noise shaper and the number of orders of the one type of the IIR filter.

On the other hand, as in the second embodiment, the number of orders of the delta sigma which can be realized when the two or more types of the frequency characteristics are provided for the plurality of the inputs needs the number of orders of the delta sigma of the number obtained by adding the number of orders (for example, 3) of the noise shaper to the total sum $n_0+n_1$ of the different number of the orders of the IIR filter, and there is a difference that its scale is enlarged.

The number of order of the noise shaper in two systems of the inputs of the second embodiment is tertiary, but of course, even if the inputs are arbitrary number, or even if the number of orders is arbitrary, the arithmetic coefficient can be guided similarly.

Incidentally, in the first and second embodiments, the coefficients $b_0$ to $b_m$ for the feedforward, and the coefficients $a_0$ to $a_m$ for the feedback are calculated by an arithmetic coefficient generator, and written in an external memory of the $\Delta\Sigma$ modulator, and the values are loaded to the respective coefficient arithmetic units by a control signal, etc. "m" is the sum of the number of orders in the IIR filter + the number of orders of the noise shaper.

Figure 13:
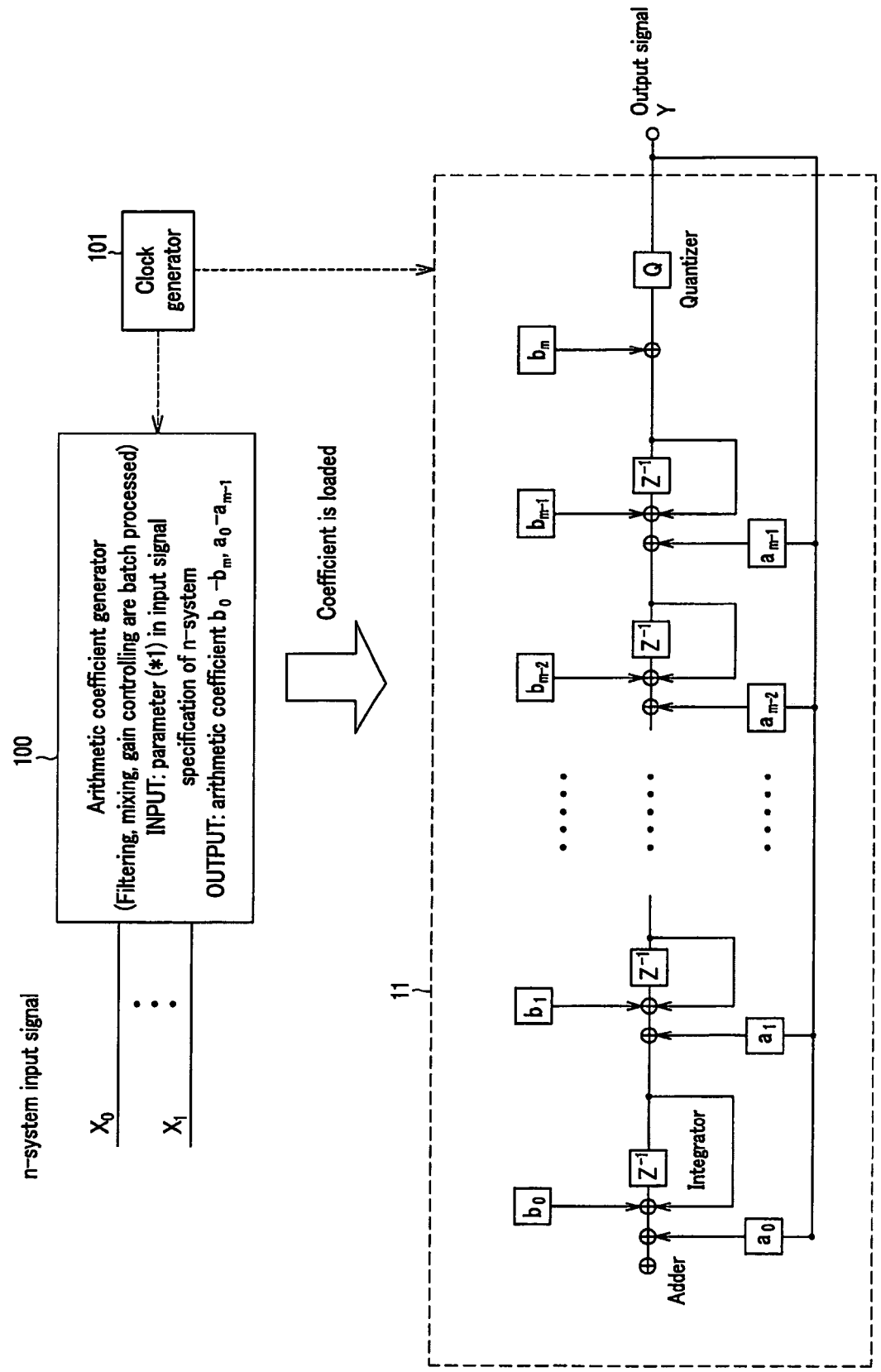
FIG. 13 is a view showing an embodiment of the ΔΣ modulator having arithmetic coefficient generator of n system input.

As shown in FIG. 13, the arithmetic coefficient generator 100 generates the coefficients $b_0$ to $b_m$, $a_0$ to $a_m$ for batch processing the filtering, the mixing and the gain controlling for the n-system inputs $X_0, \ldots X_n$ by using the parameter in the specification. As the parameter in the specification, the characteristics of the IIR filter, the characteristics of the noise shaper, the presence or absence of a local feedback, sampling frequency, etc., are used.

The arithmetic coefficient generator 100 generates the coefficient synchronously with the clock generated by a clock generator 101, and the $\Delta\Sigma$ modulator 11 or 81 loads the coefficient to the respective coefficient arithmetic unit synchronously with the clock.

Therefore, the $\Delta\Sigma$ modulator 11 loads the coefficients $b_0$ to $b_m$, $a_0$ to $a_m$ for batch processing the filtering, mixing, gain controlling stored, for example, in the memory, generated by the arithmetic coefficient generator 100 to the inputs $X_0, \ldots, X_n$ of a plurality of n systems, and can process to calculate them.

Figure 14:
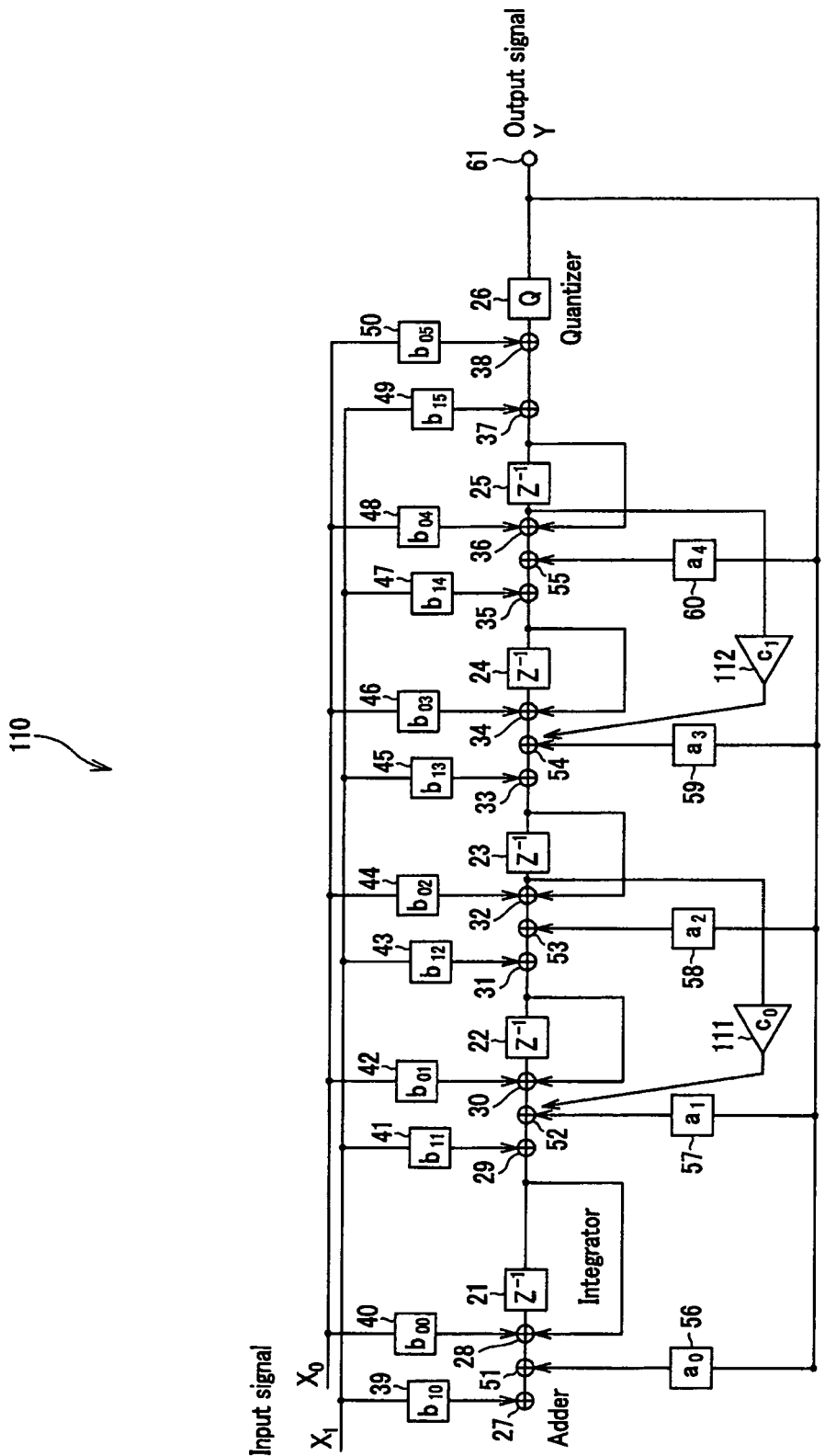
FIG. 14 is a structural view of the delta sigma modulator having a local feedback system.

Furthermore, according to the present invention, as shown in FIG. 14, a delta sigma modulator 110 having a local feedback system can guide the arithmetic coefficient similarly. That is, in FIG. 14, the delta sigma modulator 11 showing the structure in FIG. 5 is based. The input of the third integrator 23 is fed back to the input of the second integrator 22 through the coefficient arithmetic unit 111 for calculating by using the local feedback coefficient $c_0$. Further, the input of the fifth integrator 25 is fed back to the input of the fourth integrator 24 through a coefficient arithmetic unit 112 for calculating by using the local feedback coefficient $c_1$. This $\Delta\Sigma$ modulator 110 improves the characteristics of an audible band by providing a local feedback system.

As described above, in the embodiments and a modified embodiment, when a DSP process of a 1-bit audio signal as it is, such as, for example, a filtering process, a mixing process, an attenuating process, etc. are conducted, batch processing is conducted, thereby generating only one time quantization noise. Therefore, as compared with the prior art, sufficiently high S/N radio can be held, and higher tone quality can be ensured.

Moreover, when the low frequency component of the input $X_0$ is mixed with the input $X_1$ as in a conventional digital signal processing apparatus, the input $X_0$ is delayed by passing through a re-delta sigma modulator, and mixed. On the contrary, in the digital signal processing apparatus 10 of the first embodiment, since the re-$\Delta\Sigma$ modulation is performed one time by the $\Delta\Sigma$ modulator 11, there is an effect that the mixing can be performed without delay.

In the first and second embodiments, it has been described that the digital signal processing apparatus was constituted by the re-$\Delta\Sigma$ modulator using the n-order integrating section. The digital signal processing apparatus may be realized by storing the program based on the digital signal processing method of the present invention in a CD-ROM, an HDD, the other disk-like recording medium, a semiconductor recording medium, etc., and performing the program by a computer, such as a work station, a personal computer, etc.

The digital signal processing method of the present invention will be described. That is, the digital signal processing method executes at least a filter function which causes the plurality of input signals to have different frequency characteristics, and a mixing function which mixes the plurality of signals each having a different frequency characteristic due to the at least one filter function, by: an integrating step of performing an integrating step on the input signals using a plurality of integrators; a quantization step of subjecting an integrated output from the integrating step to a quantization processing; a plurality of feedforward calculation step of supplying, to the integrating step, by performing calculation processing on the plurality of input signals by using feedforward coefficients of a plurality of systems corresponding to the plurality of signals; and a plurality of feedback calculation step of performing calculation processing on the quantized output from the quantization step using feedback coefficients to feed back a calculation result to the integrating step, by using the approximately obtained feedforward coefficients of the plurality of systems and feedback coefficients, performs the delta sigma modulation process for the plurality of the input signals to output the 1-bit digital signal.

More particularly, the digital signal processing method includes: a first transfer function calculating step of calculating the transfer function of at least one filter function incorporating different frequency characteristics from each other in the plurality of the input signals; a second transfer function calculating step of calculating the transfer function of a tertiary noise shaper; a first approximate coefficient calculating step of calculating the approximate coefficient corresponding to the feedforward coefficient by a sigma step corresponding to the number of the plurality of input signals; a second approximate coefficient calculating step of calculating the approximate coefficient corresponding to the feedback coefficient by one delta step; a feedforward coefficient calculating step of calculating the feedforward coefficient from the first approximate coefficient calculated by the first approximate coefficient calculating step; and a feedback coefficient calculating step of calculating the feedback coefficient from the second approximate coefficient calculated by the second approximate coefficient calculating step. Further, the gain control function for controlling the gain is performed.

The program for embodying the digital signal processing method described above at each processing sequence can be stored in the above various type recording media. When this program recording medium is mounted in the computer, the computer takes out sequentially the steps (the process) in the work area (RAM, etc.) through a bus by a central processing unit (CPU), and performs the process to operate as the digital signal processing apparatus.

It should be understood by those skilled in the art that various modifications, combinations, sub-combinations and alternations may occur depending on design requirements and other factors insofar as they are within the scope of the appended claims or the equivalents thereof.

What is claimed is:

1. A digital signal processing apparatus for outputting a 1-bit digital signal by performing a delta sigma modulation process on a plurality of input signals, executing at least a filter function which causes the plurality of input signals to have different frequency characteristics, and a mixing function which mixes the plurality of signals each having a different frequency characteristic due to the at least one filter function, by a delta sigma modulator comprising:

integrating means having a plurality of integrators;

quantization means for subjecting an integrated output from the integrating means to quantization processing;

a plurality of feedforward arithmetic means for performing arithmetic processing on the plurality of input signals by using feedforward coefficients of a plurality of systems corresponding to the plurality of signals and supplying an arithmetic result to the integrating means; and a plurality of feedback arithmetic means for performing arithmetic processing on the quantized output from the quantization means using feedback coefficients to feed back an arithmetic result to the integrating means, by using the approximately obtained feedforward coefficients of the plurality of systems and feedback coefficients, wherein the at least one filter function includes a first infinite impulse response filter having an order $n_0$, a second infinite impulse response filter having an order $n_1$, the mixing function includes a tertiary noise shaper having an order $n_2$, and a number of the plurality of integrators is $n_0+n_1+n_2$.

2. The digital signal processing apparatus according to claim 1, wherein the delta sigma modulator comprises a sigma section corresponding to the number of the plurality of the input signals, and one delta section.

3. The digital signal processing apparatus according to claim 1, wherein the delta sigma modulator further performs a gain control function for controlling a gain.

4. The digital signal processing apparatus according to claim 1, wherein the approximately obtained feedforward coefficients of the plurality of the systems and feedback coefficients are written in storage means, and its value is loaded to the coefficient of the delta sigma modulator by a control signal, etc.

5. A digital signal processing method for performing a delta sigma modulation process on a plurality of input signals to output a 1-bit digital signal, executing at least a filter function which causes the plurality of input signals to have different frequency characteristics, and a mixing function which mixes the plurality of signals each having a different frequency characteristic due to the at least one filter function, by the steps comprising:

an integrating step of performing integrating processing on the input signals using a plurality of integrators;

a quantization step of subjecting an integrated output from the integrating step to quantization processing;

a plurality of feedforward arithmetic steps of performing arithmetic processing on the plurality of input signals by using feedforward coefficients of a plurality of systems corresponding to the plurality of signals and supplying an arithmetic result to the integrating step; and a plurality of feedback arithmetic steps of performing arithmetic processing on the quantized output from the quantization step, using feedback coefficients to feed back an arithmetic result to the integrating step, by using the approximately obtained feedforward coefficients of the plurality of systems and feedback coefficients, wherein the at least one filter function includes a first infinite impulse response filter having an order $n_0$ and a second infinite impulse response filter having an order $n_1$, the mixing function includes a tertiary noise shaper having an order $n_2$, and a number of the plurality of integrators is $n_0+n_1+n_2$.

6. The digital signal processing method according to claim 5, further comprising:

a first transfer function calculating step of calculating the transfer function of at least one filter function which causes the plurality of input signals to have different frequency characteristics;

a second transfer function calculating step of calculating the transfer function of the tertiary noise shaper;

a first approximate coefficient calculating step of calculating an approximate coefficient corresponding to the feedforward coefficient by a sigma step corresponding to the number of the plurality of the input signals;

a second approximate coefficient calculating step of calculating the approximate coefficient corresponding to the feedback coefficient by one delta step;

a feedforward coefficient calculating step of calculating the feedback coefficient from the first approximate coefficient calculated by the first approximate coefficient calculating step; and a feedback coefficient calculating step of calculating the feedback coefficient from the second approximate coefficient calculated by the second approximate coefficient calculating step.

7. The digital signal processing method according to claim 5, wherein the gain control function is further performed to control the gain.

8. A digital signal processing apparatus for outputting a 1-bit digital signal by performing a delta sigma modulation process on a plurality of input signals, comprising:

a plurality of integrating units;

a plurality of feedforward arithmetic units that supply an arithmetic result calculated based on an independent feedforward coefficient to each input signal, to each of the plurality of the integrating units;

a quantizing unit that quantizes the integrated output outputted from one of the plurality of the integrating units;

a plurality of feedback arithmetic units that supply an arithmetic result obtained by calculating quantized data outputted from the quantizing unit based on the independent feedback coefficient, to each of the plurality of the integrating units; and a mixing unit that mixes an output of an integrating unit of a front stage, an output of the feedforward arithmetic unit and an output of the feedback arithmetic unit and supplies a mixed result to an integrating unit of a rear stages, wherein the front stage includes a first infinite impulse response filter having an order $n_0$ and a second infinite impulse response filter having an order $n_1$, the mixing unit has an order $n_2$, and a number of the plurality of integrating units is $n_0+n_1+n_2$.

9. A digital signal processing apparatus for outputting a 1-bit digital signal by performing a delta sigma modulation process on a plurality of input signals, executing at least a filter function which causes the plurality of input signals to have different frequency characteristics, and a mixing function which mixes the plurality of signals each having a different frequency characteristic due to the at least one filter function, by a delta sigma modulator comprising:

an integrating unit having a plurality of integrators;

a quantization unit that subjects an integrated output from the integrating unit to quantization processing;

a plurality of feedforward arithmetic units that perform arithmetic processing on the plurality of input signals by using feedforward coefficients of a plurality of systems corresponding to the plurality of signals and supply an arithmetic result to the integrating unit; and
a plurality of feedback arithmetic units that perform arithmetic processing on the quantized output from the quantization unit using feedback coefficients to feed back an arithmetic result to the integrating unit, by using the approximately obtained feedforward coefficients of the plurality of systems and feedback coefficients, wherein the at least one filter function includes a first infinite impulse response filter having an order $n_0$ and a second infinite impulse response filter having an order $n_1$, the mixing function includes a tertiary noise shaper having an order $n_2$, and a number of the plurality of integrators is $n_0+n_1+n_2$.

* * * * *

UNITED STATES PATENT AND TRADEMARK OFFICE
CERTIFICATE OF CORRECTION

PATENT NO. : 7,215,262 B2
APPLICATION NO. : 11/219757
DATED : May 8, 2007
INVENTOR(S) : Nobukazu Suzuki et al.

It is certified that error appears in the above-identified patent and that said Letters Patent is hereby corrected as shown below:

Column 11, Line 1, please change: "Xtype" to --type--.

Column 13, Line 1, please change: "b(n-1)" to --$b_{0(n-1)}$--.

Column 13, Line 5, please change: "$9_{1(n-1)}$" to --$91_{(n-1)}$--.

Column 14, Line 2 please change: "$\leqq$" to --$\leq$-- (both occurrences).

Column 14, Line 20, please change: "$\leqq$" to --$\leq$-- (both occurrences).

Column 14, Line 34, please change: "$\leqq$" to --$\leq$-- (both occurrences).

Signed and Sealed this

Eighteenth Day of September, 2007

JON W. DUDAS
*Director of the United States Patent and Trademark Office*